United States Patent [19]

Gay

[11] 4,324,990

[45] Apr. 13, 1982

[54] COMPARISON CIRCUIT ADAPTABLE FOR UTILIZATION IN A TELEVISION RECEIVER OR THE LIKE

[75] Inventor: Michael J. Gay, Geneva, Switzerland

[73] Assignee: Motorola, Inc., Schaumburg, Ill.

[21] Appl. No.: 148,346

[22] Filed: May 9, 1980

[51] Int. Cl.³ ............................................. H03K 5/153
[52] U.S. Cl. .................................. 307/350; 307/354; 307/359; 328/151
[58] Field of Search ................ 307/228, 354, 359, 360, 307/350, 362, 530; 328/128, 151, 147, 149

[56] References Cited

U.S. PATENT DOCUMENTS 3,863,080  1/1975  Steckler .............................. 307/358
4,149,179  4/1979  Wilcox ................................. 307/354

Primary Examiner—John Zazworsky
Attorney, Agent, or Firm—Michael D. Bingham

[57] ABSTRACT

A comparison circuit suitable for utilization in a television. The comparision circuit includes an input adapted to be connected, for example, to an integrating capacitor and comprises a trigger stage adapted to switch from a first state to a second state in response to the trigger stage being activated by a gating pulse and the potential appearing across the integrating capacitor being below a first threshold level; a feedback circuit coupled between the output of the trigger circuit to the input of the comparison circuit for latching the trigger stage in an on condition and charging the capacitor until the potential thereacross exceeds a second threshold level at which time the trigger stage reverts to said first state; and a pulse generating circuit coupled with the trigger stage to produce an output pulse delayed in time from the initiation of the gating pulse in response to said trigger stage being in said second state and the potential across the integrating capacitor traversing through a third threshold level, the value of which being between said first and second threshold levels.

8 Claims, 5 Drawing Figures

COMPARISON CIRCUIT ADAPTABLE FOR UTILIZATION IN A TELEVISION RECEIVER OR THE LIKE

BACKGROUND OF THE INVENTION

The present invention relates to comparison circuits suitable for fabrication in integrated circuit form and more particularly to a comparison circuit for triggering an output pulse delayed in time in response to an applied input signal obtaining a predetermined level state.

In many types of electronic systems there is a need for a comparison circuit for producing an output signal in response to an applied input signal being of a predetermined level with respect to a reference potential. An example of the need for such a comparison circuit is a Secam television chroma demodulator system wherein the chroma information is restructured in the television receiver from two successive lines of transmitted image. In such television chroma demodulators, a line by line switch must be synchronized with the Secam signal in the correct phase to permit the foregoing. A widely used technique employs a binary divider switched by a pulse at the start of each line and set to the correct phase by an identification circuit. To obtain the correct phasing the identification circuit integrates successive identification signals provided in the received Secam signal over a period of many television lines and if the phasing is incorrect a trigger circuit is utilized for producing an identification correcting pulse for correcting the output from the binary divider.

One problem with some prior art identification circuits arise with the need to integrate the information signals over a period of many lines in order to obtain satisfactory performance with poor signal to noise ratios. Due to the extended time required for integration of the identification signals the identification correcting pulse sometimes corresponds with the divider switching period and is thus ineffective. As a result, two or more attempts at identification may be necessary in some prior art circuits.

Hence, there is a need for a comparison circuit which can produce a correction signal which can never correspond with the normal switching period of the binary divider.

SUMMARY OF THE INVENTION

It is an aspect of the present invention to provide an improved gated comparison circuit suitable for producing a delayed output in response to a predetermined relationship occurring between two signals applied thereto.

Another aspect of the present invention is to provide a comparison circuit having an input latching stage and which is gated on to produce an output pulse whenever the input signal has reached a predetermined level state.

Another aspect of the present invention is to provide a comparison circuit suitable for utilization in a Secam television receiver system to provide an identification correcting pulse for synchronizing the system.

A still further aspect of the invention is to provide a comparison circuit for indicating the presence of a signal of correctly identified phase.

In accordance with the foregoing there is provided a comparison circuit including a first differential comparator being rendered conductive in response to gating pulses applied thereto for comparing an applied input signal with a first reference potential, and further including a latch circuit coupled between an output of the first differential comparator and the input of the circuit for providing a feedback signal to the differential comparator wherein the comparator is maintained in a conductive state until the input signal is forced to a second predetermined level state, and a second differential comparator for producing an output pulse when the input signal reaches a third predetermined level state which lies between the first and second predetermined level states.

DESCRIPTION OF THE DRAWINGS

One way of carrying out the invention is described in detail below with reference to drawings which illustrate only one specific embodiment of the present invention, and which.

DETAILED DESCRIPTION OF THE PREFERRED EMBODIMENT

Figure 1:
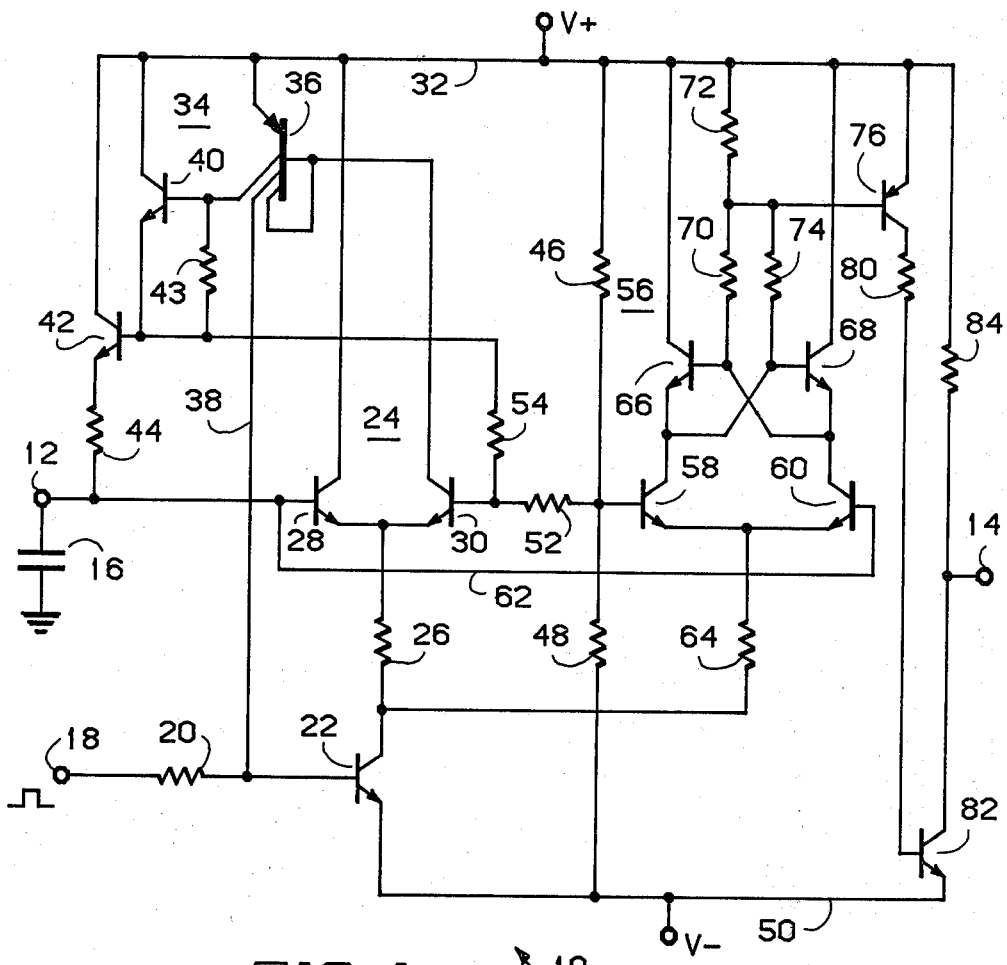
FIG. 1 is a schematic diagram illustrating the embodiment of the invention.

Turning to the FIGURES, there is illustrated in FIG. 1 comparison circuit 10 of the preferred embodiment. Comparison circuit 10 is suitable to be manufactured in integrated circuit form and includes input terminal 12 and output terminal 14. Input terminal 12 is adapted to be connected to an input signal source which, in one example, may be an integrating capacitor which may have an input signal applied thereto for charging and discharging the same in accordance with a user requirement. A gating terminal 18 is adapted to receive a gating pulse as shown and is coupled through resistor 20 to the base of current source transistor 22 of differential comparator 24. The collector of current source transistor 22 is coupled through resistor 26 to the differentially connected emitter electrodes of respective transistors 28 and 30 and the emitter is coupled to a terminal adapted to receive a reference potential. The base electrode of transistor 28 is coupled to input terminal 12 with the collector thereof returned to node at which a source of operating potential, V+, is supplied to power supply conductor 32. Comparison or trigger circuit 24 is activated by the gating pulses applied to terminal 18 for comparing the potential apearing at terminal 12 with a reference potential supplied at the base electrode of transistor 30. The output of comparison circuit 24 is taken at the collector of transistor 30 and is connected to an input of feedback circuit 34 which as will be explained latches comparator circuit 24 in a active state when the potential appearing across integrating capacitor 16 is at a predetermined level state. Feedback circuit 34 comprises a multicollector PNP transistor 36 the emitter thereof being coupled to power supply conductor 32. A first collector of transistor 36 is returned to the base electrode thereof, with a second collector output being coupled via lead 38 to the base electrode of current source transistor 22. A third collector output of transistor 36 is coupled to the base of transistor 40 and via resistor 43 to the emitter of transistor 40 as well as to the base of transistor 42. The junction point between resistor 43 and the base of transistor 42 is also coupled to the base of transistor 30 via resistor 54. The collector electrodes of transistors 40 and 42 respectively are returned to power supply conductor 32. The emitter of transistor 42 is returned through resistor 44 to input terminal 12. A resistor divider network comprising resistors 46 and 48 is coupled between power supply conductor 32 and a second power supply conductor 50 adapted to be coupled to a terminal at which is supplied the ground reference potential. The base electrode of transistor 30 is coupled through resistor 52 to the interconnected node between resistors 46 and 48. As will be explained, resistors 46 and 48 provide a first threshold level potential at the base of transistor 30 to which the potential appearing at terminal 12 (across integrating capacitor 16) is initially compared therewith.

A pulse generating circuit 56 including differentially connected transistors 58 and 60 having respective bases coupled to the interconnected node between resistors 46 and 48 and to input terminal 12 via lead 62. The emitters of transistors 58 and 60 are interconnected through resistor 64 to the collector of current source transistor 22. The differential outputs of the differential amplifier comprising transistors 58 and 60 are coupled respectively to the emitter electrodes of transistors 66 and 68 which have respective collector electrodes coupled to power supply terminal 32. The base electrode of transistor 66 is coupled both to the emitter of transistor 68 as well as to power supply conductor 32 through resistors 70 and 72. The base electrode of transistor 68 is coupled both to the emitter of transistor 66 and through resistor 74 to the interconnected leads of resistors 70 and 72. A PNP transistor 76 which produces a current at the collector thereof for generating the output pulse at output terminal 14 is shown with the emitter thereof coupled to power supply conductor 32, the base being connected to the interconnected leads of resistors 70, 72 and 74. The collector of transistor 76 is coupled via resistor 80 to the base of output transistor 82. The emitter electrode of transistor 82 is coupled to power supply conductor 50 with the collector thereof coupled to output terminal 14 and through resistor 84 to power supply conductor 32.

In conjunction with FIGS. 2A–2D the operation of comparison circuit 10 can be fully explained. Comparison amplifier or trigger circuit 24 can only be rendered active in response to a gating pulse (FIG. 2A) being applied to terminal 18 which renders transistor 22 conductive. With transistor 22 conductive, current is sourced through transistors 28 and 30. If the potential appearing across capacitor 16, at terminal 12, is greater than the bias potential or first threshold level fixed by resistors 46 and 48 (level 88, FIG. 2C) transistor 30 will be rendered nonconductive with all of the current being caused to flow through transistor 28 through resistor 26 and transistor 22. In this condition the circuit does not latch. However, if the potential appearing across capacitor 16 is less than the first threshold level 88 (point 90 of waveform 2B) when the gating pulse is initiated, transistor 30 is rendered conductive and the trigger circuit will latch due to positive feedback from the transistor 40 to the base of transistor 30. In this state, with collector current being provided to transistor 30 from transistor 36, a feedback current is produced at the multiple collector outputs thereof. Transistor 40 is rendered conductive by the collector current from transistor 36 which is coupled thereto to source a first feedback current via resistor 54 to the base of transistor 30. A second feedback current conducted via lead 38 latches current source transistor 22 is an on state such that it will remain conductive when the gating pulse applied at terminal 18 is removed, as long as feedback circuit 34 is latched. During the latch state, transistor 42 is rendered conductive by the emitter current from transistor 40 to cause charging of capacitor 16 (waveform portion 92 of FIG. 2B). In response to the trigger circuit 24 being in a latched state, the bias potential appearing at the base of transistor 30 is increased to a second threshold level 94 (FIG. 2C) to which capacitor 16 will be charged thereto. When the potential across capacitor 16 reaches the threshold level 94 trigger circuit 24 switches off regeneratively. Thus, the comparison or trigger circuit 24 will switch to the latch state for a defined period initiated by the first gating pulse applied after the potential across capacitor 16 drops below the first threshold level 88.

Figure 2A:
FIGS. 2A-2D are a timing diagrams useful for explaining the operation of the invention illustrated in FIG. 1.
Figure 2B:
Figure 2C:
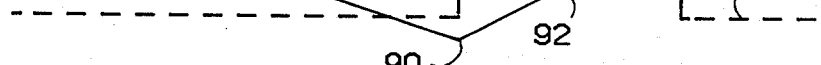

Pulse generating circuit 56 is rendered operational when transistor 22 is saturated by the applied gating pulse and while the trigger circuit is latched. Pulse generating circuit 56 generates an output current only when the differential voltage applied between the base electrodes of transistors 58 and 60 is substantially zero. For example, if at the initiation of a gating pulse the potential across capacitor 16 is below first threshold level 88, a large differential voltage appears across the base electrodes of transistors 58 and 60 such that transistor 58 is rendered conductive to substantially pass the whole of the current available through resistor 64. In this state, the potential appearing at base electrode of transistor 58 is represented by a third threshold level 96 (FIG. 2C). The current conducted through transistor 58 is provided both through the collector-emitter path of transistor 66 and resistors 72 and 74 respectively. The current passed through resistors 72 and 74 is just sufficient to develop a base-to-emitter voltage across resistor 74 to bring transistor 66 into conduction. Provided that resistor 72 is substantially lower than resistor 74, transistor 76 will not receive sufficient base-to-emitter voltage to be rendered conductive. The same is true if transistor 60 should be rendered conductive to pass the whole of the current available through resistor 64.

Figure 2D:

Therefore, as long as the potential across capacitor 16 remains less than the threshold level 96 transistor 76 is maintained in a nonconductive state. However, as capacitor 16 charges up to threshold level 96 the potential appearing on the bases of transistors 58 and 60 become equal so that the current available through resistor 64 is shared equally between the two collectors thereof. In this state neither transistor 66 or 68 can remain conductive and are turned off. With transistors 66 and 68 rendered nonconductive, all of the current available passes through resistor 72 to provide base drive current for transistor 76 rendering it conductive. As transistor 76 is rendered conductive a current pulse 98 is produced at the collector thereof as shown in FIG. 2D. Capacitor 16 will continue to charge to threshold level 94 at which time the feedback circuit 34 is rendered non-operative and comparison circuit 10 is no longer latched to an on condition.

As described above, comparison circuit 10 provides an output pulse delayed in time from an applied gating pulse only if the potential appearing across terminal 12 is less than the initial threshold level set by the resistor divider network comprising resistors 46 and 48. The comparison circuit will remain in a "latched on" condition until such time that the capacitor is charged by feedback circuit 34 to an "off" threshold level value at which time the comparison circuit is no longer activated.

In no way intending to limit the scope of the present invention, comparison circuit 10 could be utilized as part of the identification circuit of a television receiver adapted to receive Secam broadcast signals to provide the aforementioned identification correcting pulse to insure that the television is in synchronization with the transmitted signals. In this application, capacitor 16 would be an integrating capacitor with the potential appearing thereacross being maintained greater than the initial threshold level 88 whenever the television receiver was in correct synchronization and would be discharged below this first threshold if the television system was out of sync such that the pulse provided at terminal 14 could be utilized to correct the phasing in order to obtain synchronization.

The advantage of the method described above for generating output pulse 98 lies in that the pulse is delayed a predetermined time after the gating pulse is initiated which activates the trigger circuit in synchronism with the previously mentioned binary divider used for correcting the phase of the system. Hence, the correction pulse can not be initiated at the same time that the binary divider changes states. Thus, only one attempt must be made at identifying the correct phase of the incoming identification signal.

I claim:

1. A comparison circuit comprising a trigger stage having an input and output, the input of said trigger stage being adapted to receive an input signal, and a feedback circuit interposed between said output and said input of said trigger stage; said trigger stage being rendered active in response to a gating pulse applied thereto such that said trigger stage being caused to switch from a first state to a second state when activated if the magnitude of said input signal is below a first threshold level wherein the magnitude of said input signal is increased to a second threshold level by said feedback circuit; and a pulse generating circuit coupled to said trigger stage having an output coupled to an output of the comparison circuit to produce an output pulse thereat when said trigger stage is in said second state and the magnitude of the input signal traverses a third threshold level, said third threshold level having a value between said first and second threshold levels.

2. The comparison circuit of claim 1 wherein said trigger stage includes a differential amplifier including a pair of differentially connected transistors and a current source transistor having its collector-to-emitter path being coupled between the emitters of said pair of transistors and a first terminal adapted to receive a reference potential, the base of said current source transistor being adapted to receive said gating pulse to activate said differential amplifier, the base of the first one of said pair of transistors being adapted to receive said input signal, the collector thereof being coupled to a second terminal adapted to receive a source of operating potential, the base of the second one of said pair of transistors being adapted to receive a first bias potential and the collector thereof being the output of said trigger stage.

3. The comparison circuit of claim 2 wherein said feedback circuit including a multiple collector transistor of complementary type to said pair of transistors, the emitter thereof being coupled to said second terminal, a first collector thereof being connected to the base of the same to said collector of said second transistor of said pair of transistors, a second collector thereof being coupled to said base of said current source transistor, and a third collector being coupled both to the input of the trigger stage and to said base of said second transistor of said pair of transistors such that the magnitude of the input signal is caused to be increased to said second threshold level and the magnitude of said bias potential is changed from a first threshold value to a second threshold value.

4. The comparison circuit of claim 3 wherein said feedback circuit further includes a first transistor, the base thereof being coupled to said third collector of said multiple collector transistor, the collector being coupled to said second terminal, the emitter being coupled to said base of said second transistor of said pair of transistors; and a second transistor, the collector thereof being coupled to said second terminal, the base being coupled to the emitter of said first transistor, the emitter being coupled to the input of the trigger stage, said first and second transistors being of complementary conductive type with respect to said multiple collector transistor.

5. The comparison circuit of claim 4 wherein said input of the comparison circuit being adapted to be connected to an integrating capacitor across which the input signal is developed, and said second transistor of the feedback circuit charging said integrating capacitor when the trigger stage is in said second state.

6. The comparison circuit of claim 2 or 5 wherein said pulse generating circuit includes a second pair of differentially connected transistors, the emitters thereof being coupled to said collector of said current source transistor, the base of the first one of said second pair of transistors being coupled with the base of the second transistor of said first pair of transistors, the base of the second one of said second pair of transistors being coupled to the input of the comparison circuit, the collectors of said respective transistors of said second pair of transistors being coupled to said second terminal.

7. The comparison circuit of claim 6 wherein said pulse generating circuit further includes a first transistor, the collector thereof being connected to said second terminal, the emitter being connected to said collector of said first transistor of said second pair, the base being connected to said collector of said second transistor of said second pair; a second transistor, the collector thereof being connected to said second terminal, the emitter being connected to said collector of said second transistor of said second pair, the base being connected to said collector of said first transistor of said second pair; said base of said first transistor being connected through a first resistor to a common node; said base of said second transistor being coupled through a second resistor to said common node; a third resistor coupled between said second terminal and said common node; and a third transistor of complementary conductivity type with respect to said first and second transistors, the emitter thereof being connected to said second terminal, the base being coupled to said common node, and the collector being coupled both to said base of said current source transistor and to the output of the comparison circuit.

8. The comparison circuit of claim 7 wherein said pulse generating circuit including a fourth transistor, the base thereof being coupled to said collector of said third transistor, the emitter being coupled to said first terminal, and said collector being coupled both to said second terminal and the output of the comparison circuit.

* * * * *